United States Patent
Dershem et al.

(10) Patent No.: US 7,786,248 B2
(45) Date of Patent: *Aug. 31, 2010

(54) UNDERFILL COMPOSITIONS AND METHODS FOR USE THEREOF

(75) Inventors: Stephen M. Dershem, San Diego, CA (US); Debbie Forray, San Diego, CA (US)

(73) Assignee: Designer Molecules, Inc., San Diego, CA (US)

( * ) Notice: Subject to any disclaimer, the term of this patent is extended or adjusted under 35 U.S.C. 154(b) by 1199 days.

This patent is subject to a terminal disclaimer.

(21) Appl. No.: 11/207,987

(22) Filed: Aug. 19, 2005

(65) Prior Publication Data

US 2006/0069232 A1 Mar. 30, 2006

Related U.S. Application Data

(60) Provisional application No. 60/603,325, filed on Aug. 20, 2004.

(51) Int. Cl.
*C08G 63/00* (2006.01)
*C08G 63/02* (2006.01)
*C09K 3/00* (2006.01)
(52) U.S. Cl. .................... 528/274; 528/272; 252/183.11
(58) Field of Classification Search ................. 528/272, 528/274
See application file for complete search history.

(56) References Cited

U.S. PATENT DOCUMENTS

| 5,128,746 A | * | 7/1992 | Pennisi et al. | ............... 257/738 |
| 5,891,566 A | * | 4/1999 | Sakumoto et al. | ........... 428/343 |
| 6,355,750 B1 | * | 3/2002 | Herr | .......................... 526/262 |
| 7,285,613 B2 | * | 10/2007 | Dershem et al. | ............ 526/285 |

* cited by examiner

*Primary Examiner*—Mark Eashoo
*Assistant Examiner*—Peter F Godenschwager
(74) *Attorney, Agent, or Firm*—The Law Office of Jane K. Babin, Professional Corporation; Jane K. Babin

(57) ABSTRACT

The invention is based on the discovery that certain polyester-linked compounds are useful as components in underfill compositions for the microelectronic packaging industry.

16 Claims, No Drawings

UNDERFILL COMPOSITIONS AND METHODS FOR USE THEREOF

RELATED APPLICATIONS

This application claims the benefit moieties of priority of U.S. Provisional Application Ser. No. 60/603,325 filed Aug. 20, 2004, the entire disclosure of which is incorporated herein by reference.

FIELD OF THE INVENTION

The present invention relates generally to adhesive compositions for use in the electronic packaging industry. In particular, the present invention relates to thermosetting compositions containing polyester-linked compounds bearing crosslinkable functional groups.

BACKGROUND OF THE INVENTION

Adhesive compositions, particularly conductive adhesives, are used for a variety of purposes in the fabrication and assembly of semiconductor packages and microelectronic devices. The more prominent uses include bonding of electronic elements such as integrated circuit chips to lead frames or other substrates, and bonding of circuit packages or assemblies to printed wire boards. Adhesives useful for electronic packaging applications typically exhibit properties such as good mechanical strength, curing properties that do not affect the component or the carrier, and thixotropic properties compatible with application to microelectronic and semiconductor components.

When a semiconductor chip is connected to a substrate, electrical connections are made between electrical terminations on the chip and corresponding electrical terminations on the substrate. A typical method for making these connections uses metallic or polymeric material that is applied in bumps (e.g., solder bumps) to the chip or substrate terminals. The solder bumps are aligned and placed in contact and the resulting assembly heated to reflow the metallic or polymeric material and solidify the connection.

During subsequent manufacturing steps, the electronic assembly is subjected to cycles of elevated and lowered temperatures. Due to the differences in the coefficient of thermal expansion for the semiconductor chip, the interconnect material, and the substrate, this thermal cycling can stress the components of the assembly and cause it to fail. To prevent failure, the gap between the component and the substrate is filled with a polymeric material, usually referred to as an underfill, to reinforce the interconnect and to absorb some of the stress of the thermal cycling.

Two prominent uses for underfill technology are in packages known in the industry as flip-chip, in which a chip is attached to a lead frame, and ball grid array, in which a package of one or more chips is attached to a printed wire board.

The underfill encapsulation may take place after the reflow of the metallic or polymeric interconnect, or it may take place simultaneously with the reflow. If underfill encapsulation takes place after reflow of the interconnect, a measured amount of underfill encapsulant material will be dispensed along one or more peripheral sides of the electronic assembly and capillary action within the component-to-substrate gap draws the material inward. The substrate may be preheated if needed to achieve the desired level of encapsulant viscosity for the optimum capillary action. After the gap is filled, additional underfill encapsulant may be dispensed along the complete assembly periphery to help reduce stress concentrations and prolong the fatigue life of the assembled structure. The underfill encapsulant is subsequently cured to reach its optimized final properties.

If underfill encapsulation is to take place simultaneously with reflow of the solder or polymeric interconnects, the underfill encapsulant, which can include a fluxing agent if solder is the interconnect material, first is applied to either the substrate or the component; then terminals on the component and substrate are aligned and contacted and the assembly heated to reflow the metallic or polymeric interconnect material. During this heating process, curing of the underfill encapsulant occurs simultaneously with reflow of the metallic or polymeric interconnect material.

For single chip packaging involving high volume commodity products, a failed chip can be discarded without significant loss. However, it becomes expensive to discard multichip packages with only one failed chip and the ability to rework the failed component would be a manufacturing advantage. Thus, there is a continuing need within the semiconductor industry for underfill materials that will meet all the requirements for reinforcement of the electrical interconnect.

SUMMARY OF THE INVENTION

The invention is based on the discovery that a certain polyester linked compounds are useful as components in underfill applications. In one embodiment of the invention, there are provided underfill compositions including a) at least one compound having the structure:

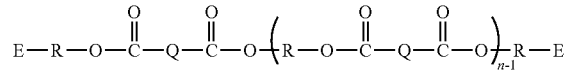

wherein:
R and Q are each independently substituted or unsubstituted aliphatic, aryl, or heteroaryl;
each E is independently an acrylate, methacrylate, or a ring-opening or ring-forming polymerizable moiety; and
n is 1 to about 10;
b) an acidic fluxing agent; and
c) a filler.

In another embodiment, there are provided methods for adhesively attaching a silicon die having at least one solderable contact to a substrate. Such methods can be performed, for example, by a) contacting the die with the substrate via the at least one solderable contact, thereby forming an electronic assembly;
b) providing the underfill composition set forth herein between the die and the substrate;
c) subjecting the assembly to a temperature sufficient to reflow the solderable contacts and cure the underfill composition, thereby adhesively attaching a silicon die having at least one solderable contact to a substrate.

DETAILED DESCRIPTION OF THE INVENTION

It is to be understood that both the foregoing general description and the following detailed description are exemplary and explanatory only and are not restrictive of the invention claimed. As used herein, the use of the singular includes the plural unless specifically stated otherwise. As used herein, "or" means "and/or" unless stated otherwise. Furthermore, use of the term "including" as well as other forms, such as "includes," and "included," is not limiting.

The section headings used herein are for organizational purposes only and are not to be construed as limiting the subject matter described. Unless specific definitions are provided, the nomenclatures utilized in connection with, and the laboratory procedures and techniques of analytical chemistry, synthetic organic and inorganic chemistry described herein are those known in the art. Standard chemical symbols are used interchangeably with the full names represented by such symbols. Thus, for example, the terms "hydrogen" and "H" are understood to have identical meaning. Standard techniques may be used for chemical syntheses, chemical analyses, and formulation.

Polyester-linked compounds are provided as components in underfill compositions. In one embodiment of the invention there are provided underfill compositions including a) at least one compound having the structure:

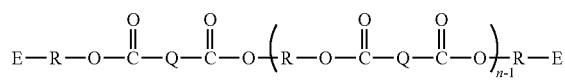

wherein:

R and Q are each independently substituted or unsubstituted aliphatic, aryl, or heteroaryl;

each E is independently an acrylate, methacrylate, or a ring-opening or ring-forming polymerizable moiety; and n is 1 to about 10;

b) an acidic fluxing agent; and c) a filler.

As used herein, "aliphatic" refers to any alkyl, alkenyl, or cycloalkyl moiety.

As used herein, "alkyl" refers to straight or branched chain hydrocarbyl groups having from 1 up to about 100 carbon atoms. "Substituted alkyl" refers to alkyl moieties bearing substituents including alkyl, alkenyl, alkynyl, hydroxy, oxo, alkoxy, mercapto, cycloalkyl, substituted cycloalkyl, heterocyclic, substituted heterocyclic, aryl, substituted aryl, heteroaryl, substituted heteroaryl, aryloxy, substituted aryloxy, halogen, haloalkyl, cyano, nitro, nitrone, amino, amido, —C(O)H, —C(O)—, —S—, —S(O)$_2$—, —OC(O)—O—, —NR—C(O)—, —NR—C(O)—NR—, —OC(O)—NR—, wherein R is H or lower alkyl, acyl, oxyacyl, carboxyl, carbamate, sulfonyl, sulfonamide, sulfuryl, and the like.

As used herein, "cycloalkyl" refers to cyclic ring-containing groups containing in the range of about 5 up to about 20 carbon atoms, and "substituted cycloalkyl" refers to cycloalkyl groups further bearing one or more substituents as set forth above. In some embodiments, the cycloalkyl refers to cyclic ring-containing groups containing in the range of about 5 up to about 12 carbon atoms As used herein, "aryl" refers to aromatic groups having in the range of 6 up to 14 carbon atoms and "substituted aryl" refers to aryl groups further bearing one or more substituents as set forth above.

As used herein, "heterocyclic" refers to cyclic (i.e., ring-containing) groups containing one or more heteroatoms (e.g., N, O, S, or the like) as part of the ring structure, and having in the range of 3 up to 14 carbon atoms and "substituted heterocyclic" refers to heterocyclic groups further bearing one or more substituents as set forth above. The term "heterocyclic" is also intended to refer to heteroaryl moieties.

As used herein, "alkenyl" refers to straight or branched chain hydrocarbyl groups having at least one carbon-carbon double bond, and having in the range of about 2 up to 100 carbon atoms, and "substituted alkenyl" refers to alkenyl groups further bearing one or more substituents as set forth above.

As used herein, the term "acrylate" refers to a compound bearing at least one moiety having the structure:

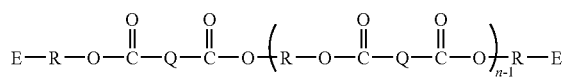

As used herein, the term "methacrylate" refers to a compound bearing at least one moiety having the structure:

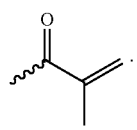

As used herein, the term "maleimide" refers to a compound bearing at least one moiety having the structure:

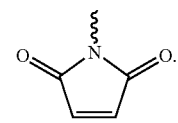

As used herein, the term "epoxy" refers to a compound bearing at least one moiety having the structure:

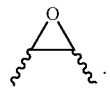

As used herein, the term "vinyl ether" refers to a compound bearing at least one moiety having the structure:

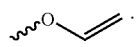

As used herein, the term "acrylamide" refers to a compound bearing at least one moiety having the structure:

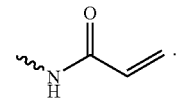

As used herein, the term "methacrylamide" refers to a compound bearing at least one moiety having the structure:

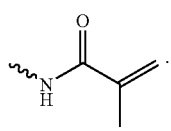

In certain embodiments, R is a substituted or unsubstituted cycloalkyl having from 5 to about 20 carbon atoms. In other embodiments, R is a substituted or unsubstituted cycloalkyl having from 5 to about 12 carbon atoms. In some embodiments, R is a substituted or unsubstituted cyclopentyl, cyclohexyl, norbornyl, tetracyclododecyl, or dicyclopentadienyl.

A wide variety of aryl and heteroaryl moieties are contemplated for Q in the practice of the invention. In some embodiments, Q is a substituted or unsubstituted aryl or heteroaryl having from 6 to about 14 carbon atoms. In other embodiments, Q is a substituted or unsubstituted phenyl or naphthyl. In further embodiments, Q is a substituted or unsubstituted cycloalkyl, such as, for example, norbornyl.

In certain embodiments, the variable "n", as used in the structure set forth above, ranges from 1 to about 7. In other embodiments, n ranges from 1 to about 5. In other embodiments, n ranges from 1 to 3. In still other embodiments, n is 1 or 2.

It is understood that a wide variety of polyester linked acrylates and methacrylates are contemplated for use in the practice of the invention. Some exemplary invention compounds are set forth below:

Compound 1

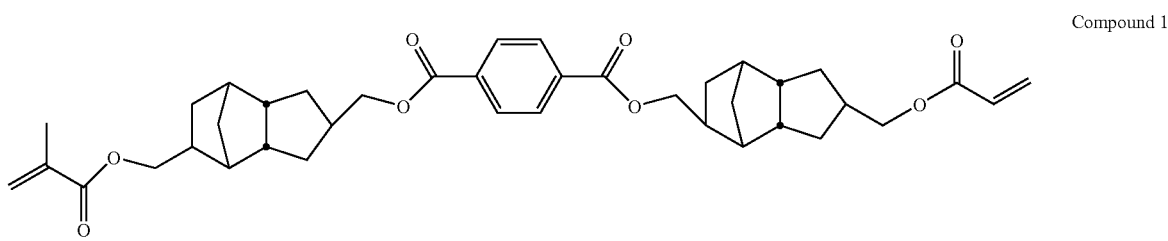

Compound 2

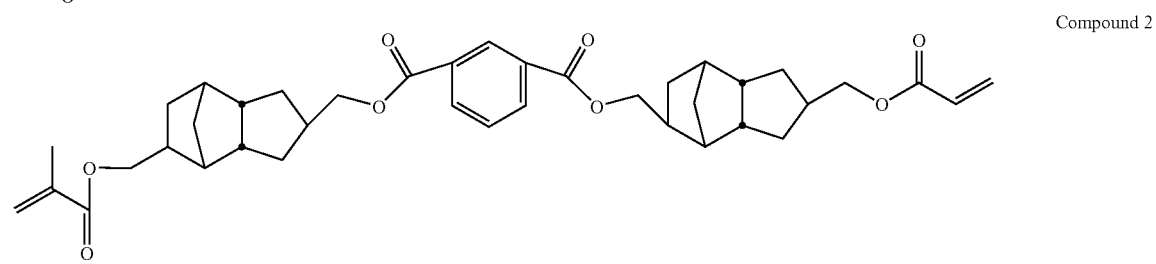

Compound 3

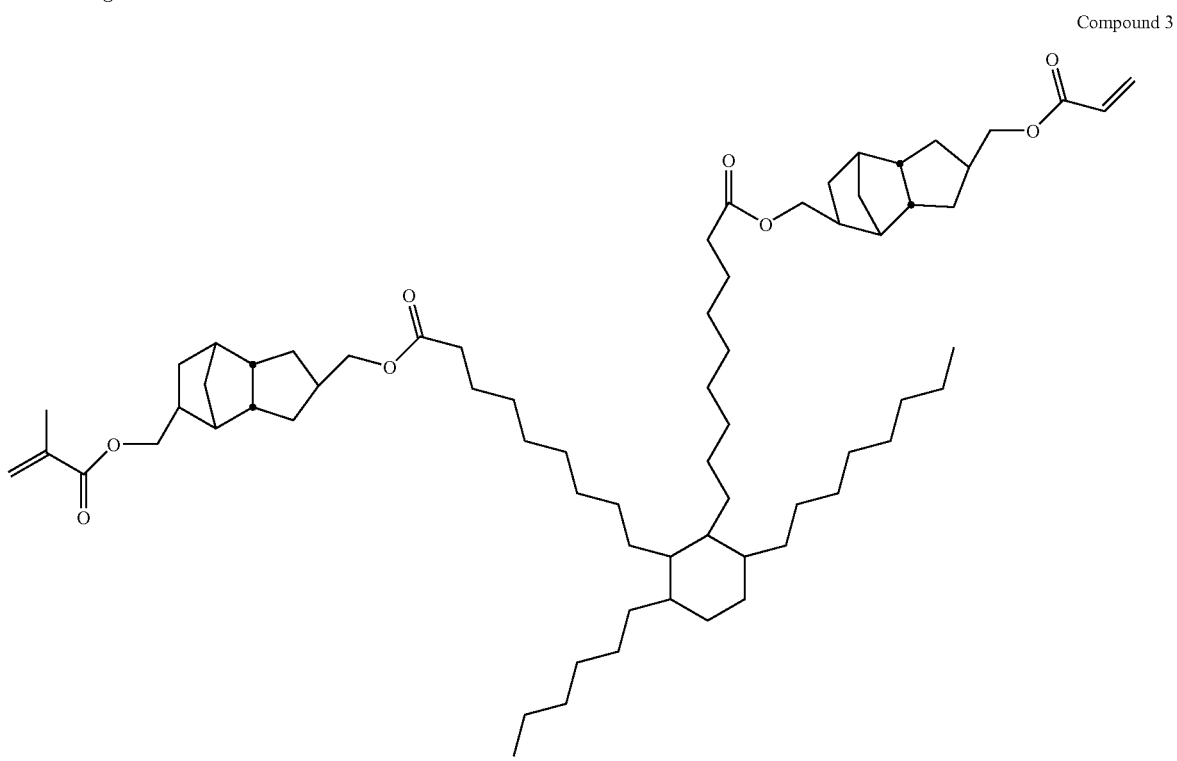

Compound 4
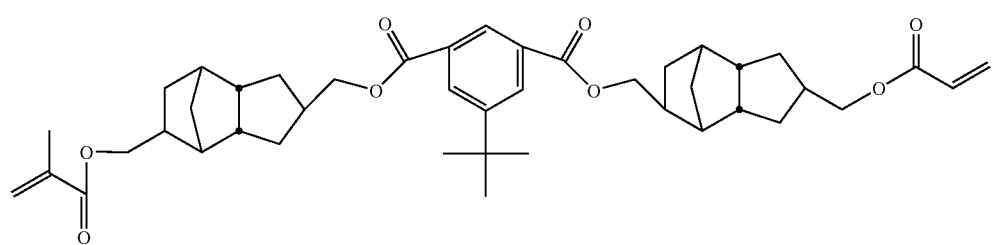
Compound 5
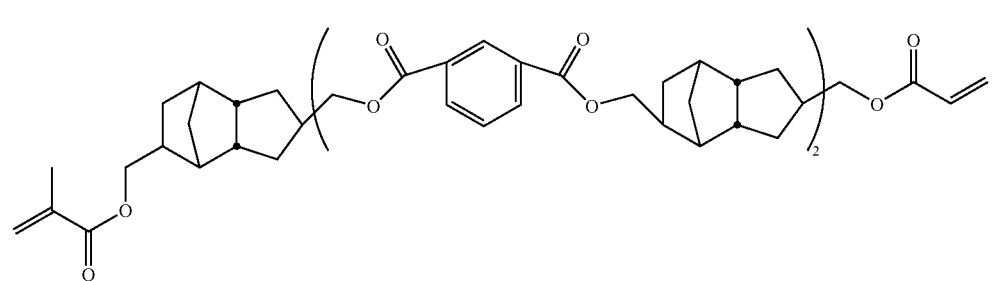
Compound 6
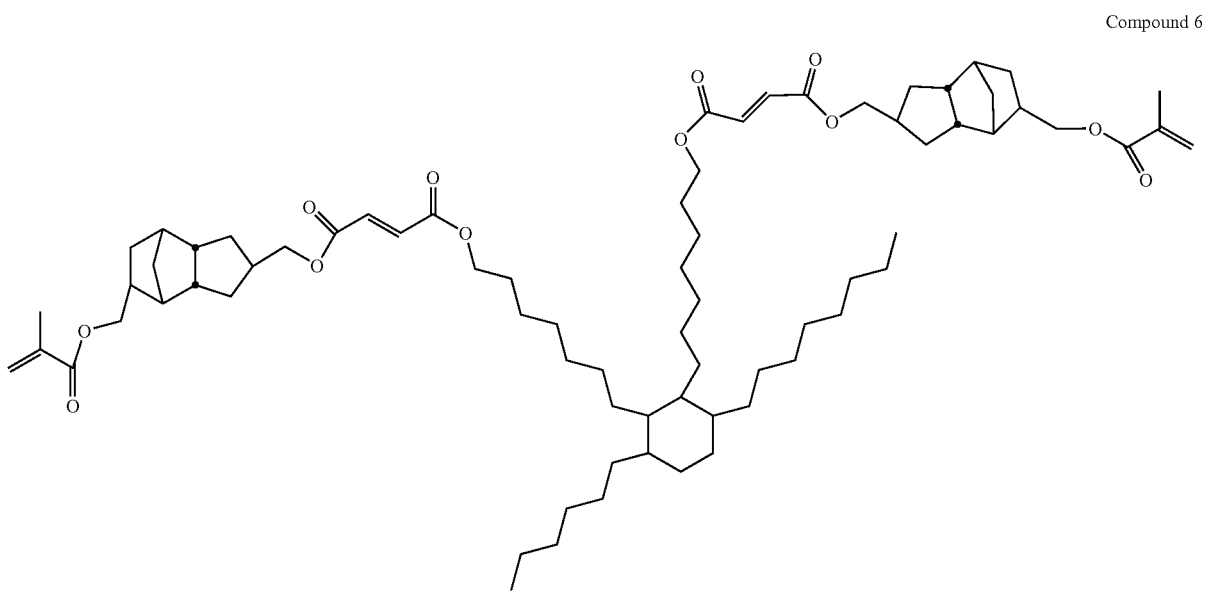
Compound 7
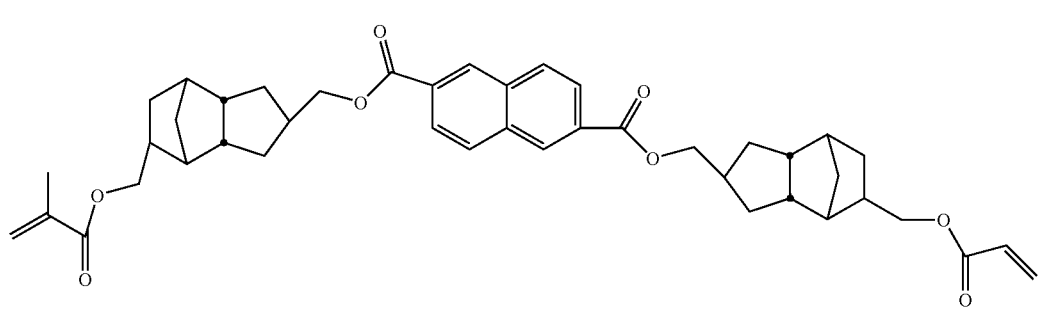

-continued
Compound 8
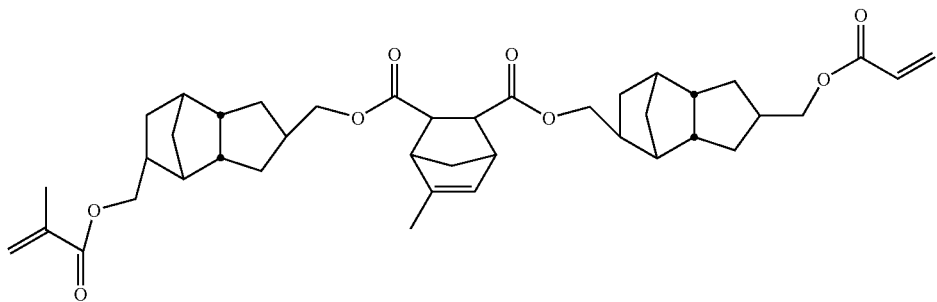
Compound 9
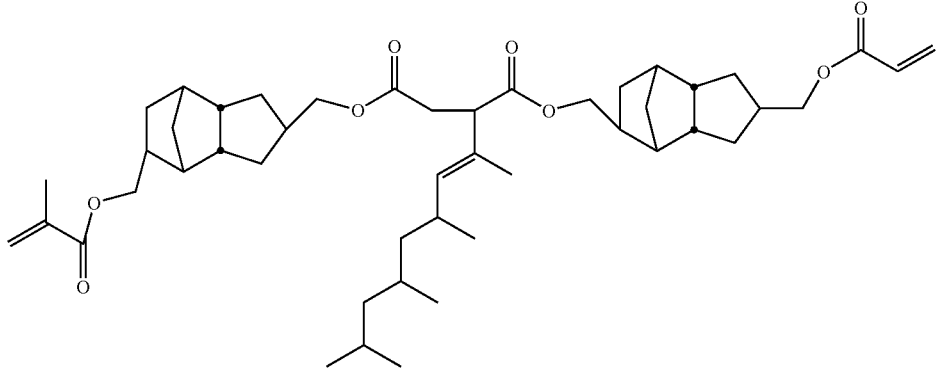
Compound 10
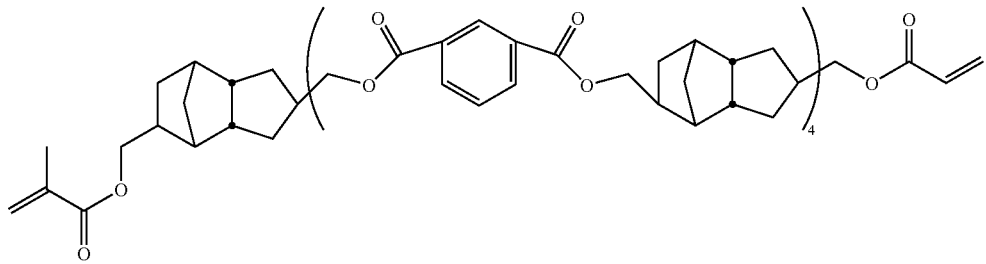
Compound 11
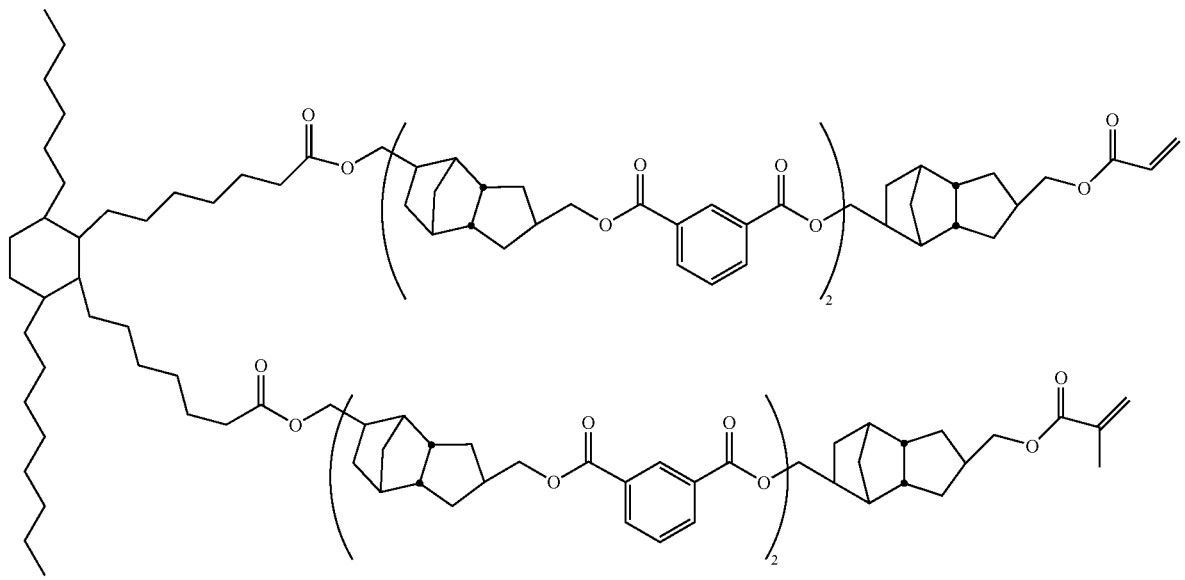

Compound 12
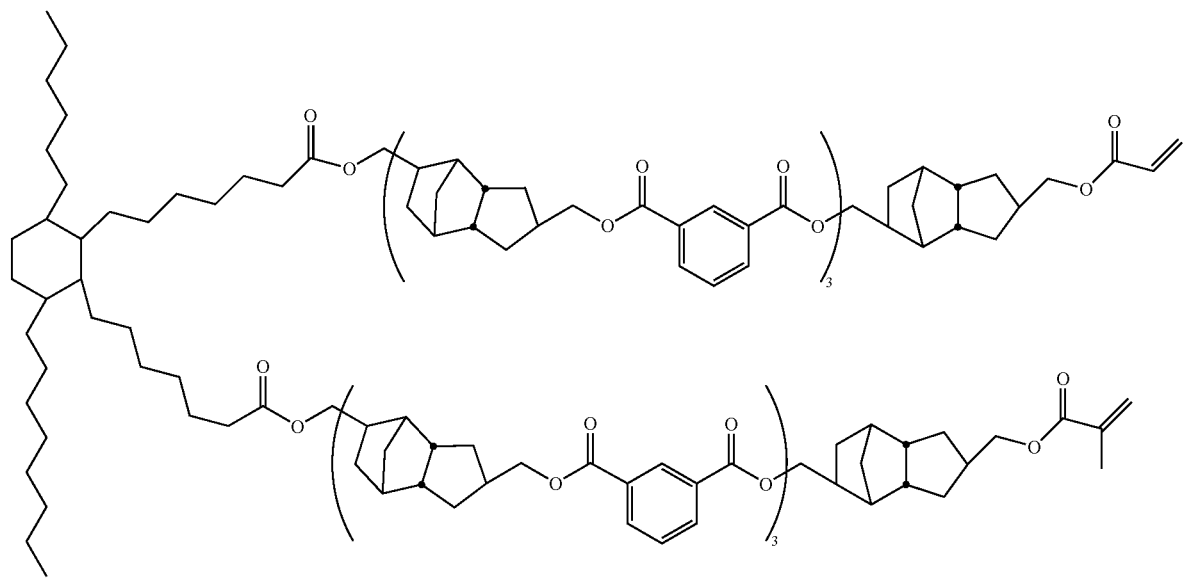
Compound 13
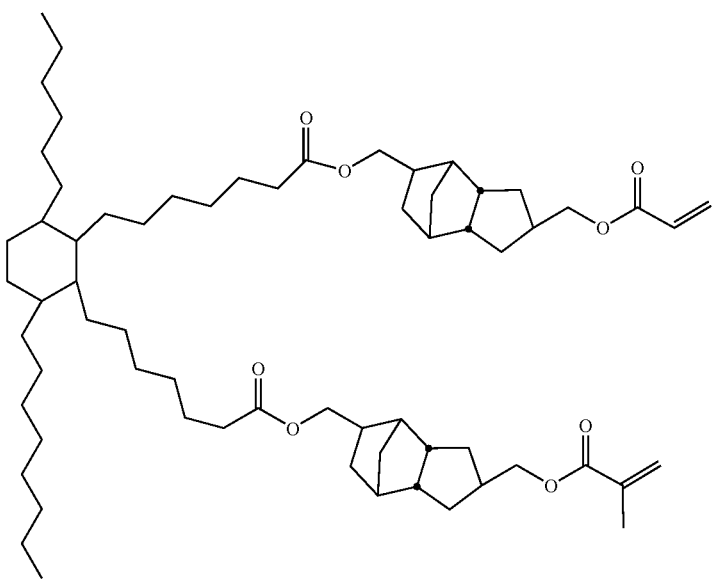
Compound 14
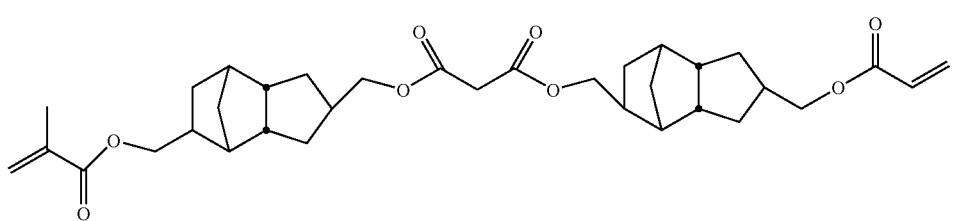
Compound 15
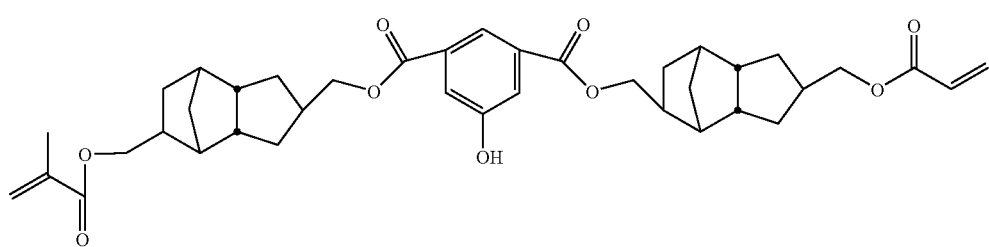

-continued
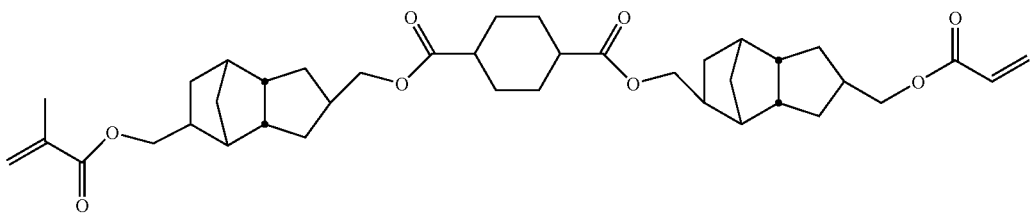
Compound 16
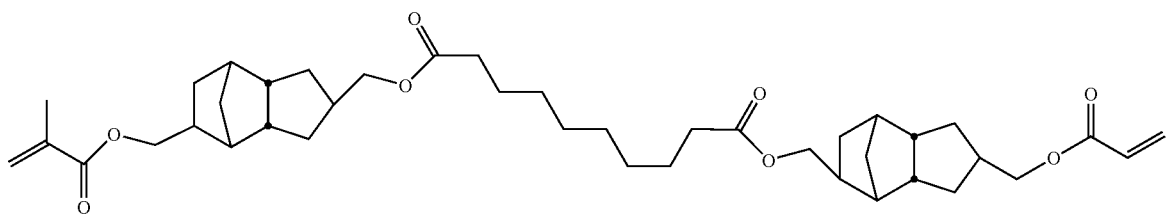
Compound 17
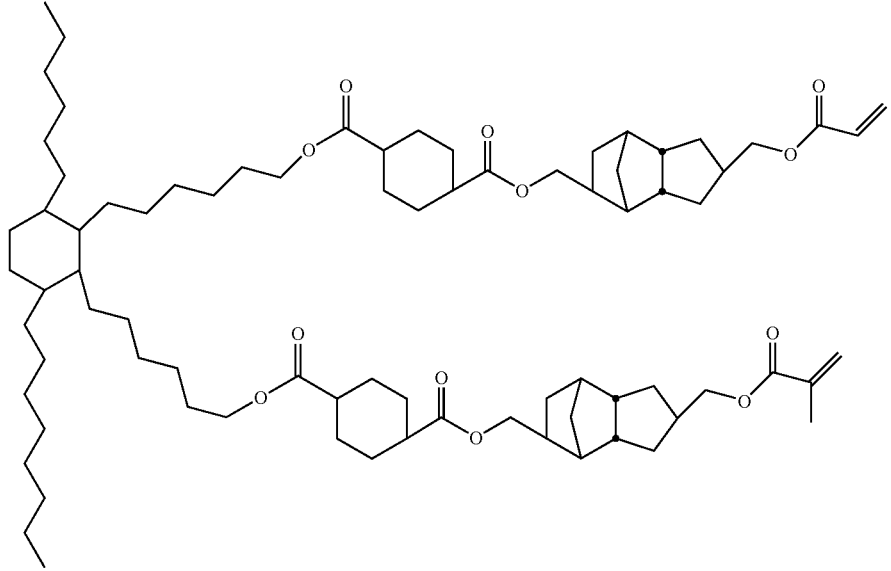
Compound 18
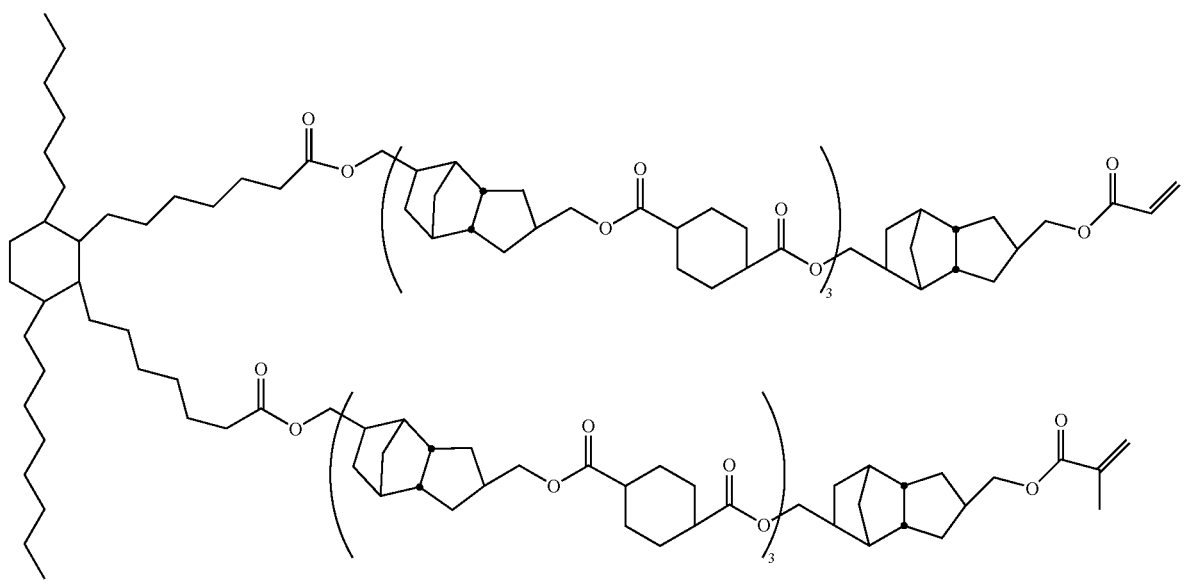
Compound 19

Compound 20
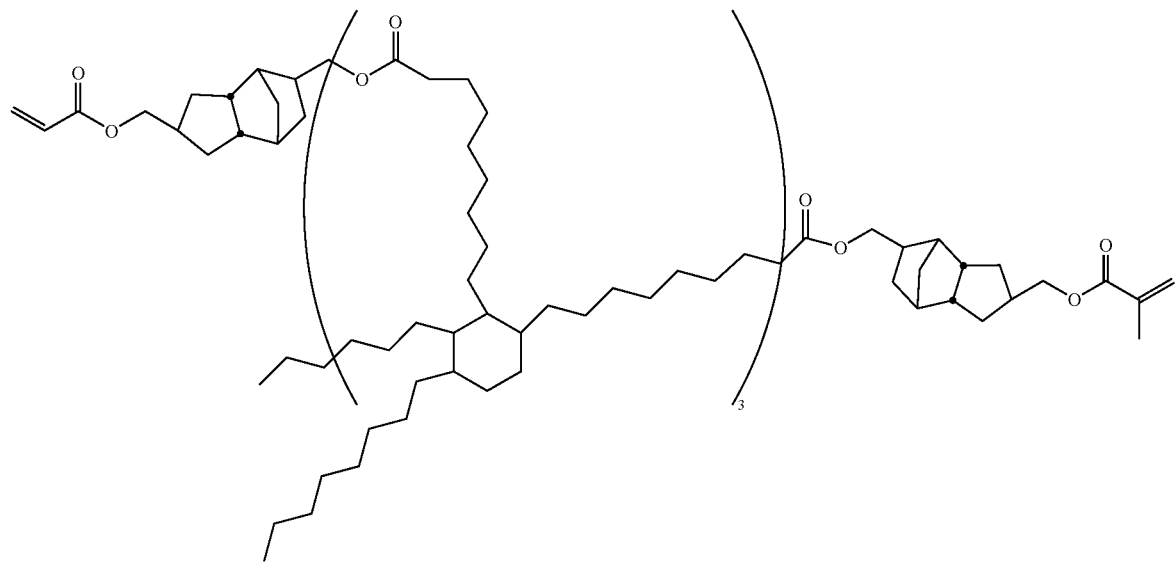
Compound 21
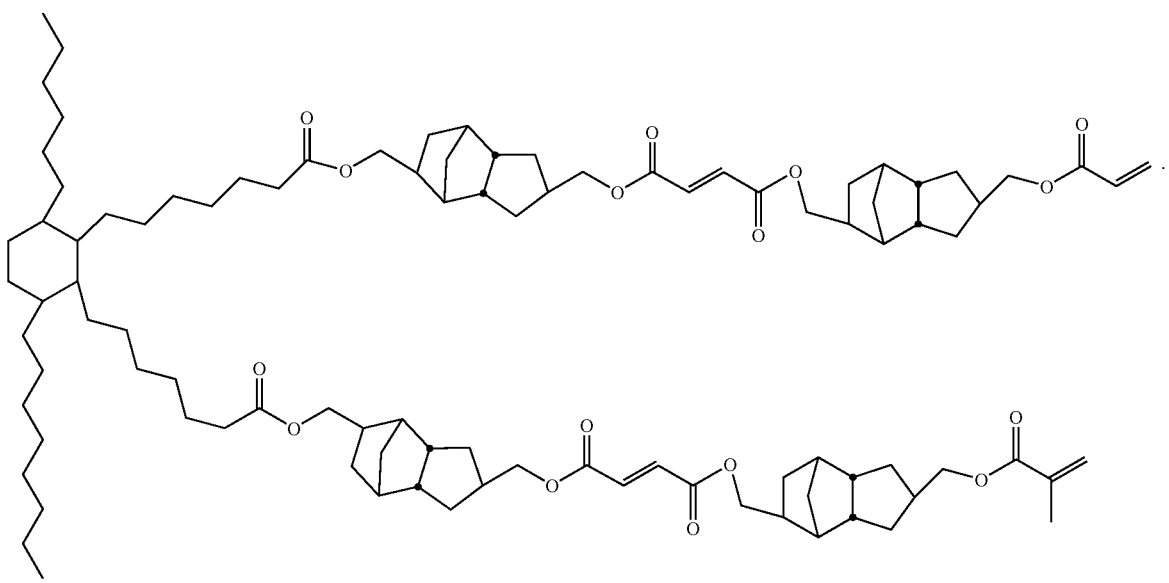

A wide variety of ring opening and/or ring forming polymerizable moieties are contemplated for use in the practice of the invention. Ring opening moieties include, for example, epoxy, oxetane, oxazoline, benzoxazine, and the like. Ring forming moieties include, for example, cyanate ester, propargyl ether, and the like.

The compounds of the invention are readily prepared according to organic chemistry techniques well-known to those skilled in the art. For example, the esters described herein are typically prepared by conversion of the acid to the corresponding ester under acid or base catalysis.

A wide variety of acids are contemplated for use as the acidic fluxing agent. Typically, the acidic fluxing agent is a carboxylic acid such as, for example, 3-cyclohexene-1-carboxylic acid, 2-hexeneoic acid, 3-hexeneoic acid, 4-hexeneoic acid, acrylic acid, methacrylic acid, crotonic acid, vinyl acetic acid, tiglic acid, 3,3-dimethylacrylic acid, trans-2-pentenoic acid, 4-pentenoic acid, trans-2-methyl-2-pentenoic acid, 2,2-dimethyl-4-pentenoic acid, trans-2-hexenoic acid, trans-3-hexenoic acid, 2-ethyl-2-hexenoic acid, 6-heptenoic acid, 2-octenoic acid, (±)-citronellic acid, (R)-(+)-citronellic acid, (S)-(−)-citronellic acid, undecylenic acid, myristolic acid, palmitoleic acid, oleic acid, elaidic acid, cis-11-eicosenoic acid, erucic acid, nervonic acid, cis-3-chloroacrylic acid, trans-3-chloroacrylic acid, 2-bromoacrylic acid, 2-(trifluoromethyl)acrylic acid, 2-(bromomethyl)acrylic acid, 2-cyclopentene-1-acetic acid, (1R-trans)-2-(bromomethyl)-2-methyl-3-methylenecyclopentaneacetic acid, 2-acetamidoacrylic acid, 5-norbornene-2-carboxylic acid, 3-(phenylthio)acrylic acid, trans-styrylacetic acid, trans-cinnamic acid, alpha-methylcinnamic acid, alpha-phenylcinnamic acid, 2-(trifluoromethyl)cinnamic acid, 2-chlorocinnamic acid, 2-methoxycinnamic acid, cis-2-methoxycinnamic acid, 3-methoxycinnamic acid, 4-methylcinnamic acid, 4-methoxycinnamic acid, 2,5-dimethoxycinnamic acid, 3,4-(methylenedioxy)cinnamic acid, 2,4,5-trimethoxycinnamic acid, 3-methylindene-2-carboxylic acid, and trans-3-(4-methylbenzoyl)acrylic acid, oxalic acid, malonic acid, methylmalonic acid, ethylmalonic acid, butylmalonic acid, dimethylmalonic acid, diethylmalonic acid, succinic acid, methylsuccinic acid, 2,2-dimethylsuccinic acid, 2-ethyl-2-methylsuccinic acid, 2,3-dimethylsuccinic acid, meso-2,3-dimethylsuccinic acid, glutaric acid, (±)-2-methylglutaric acid, 3-methylglutaric acid, 2,2-dimethylglutaric acid, 2,4-dimethylglutaric acid, 3,3-dimethylglutaric acid, adipic acid, 3-methyladipic acid, (R)-(+)-3-methyladipic acid, 2,2,5,5-tetramethylhexanedioic acid, pimelic acid, suberic acid, azelaic acid, 1,10-decanedicarboxylic acid, sebacic acid, 1,11-undecanedicarboxylic acid, undecanedioic acid, 1,12-dodecanedicarboxylic acid, hexadecanedioic acid, docosanedioic acid, tetracosanedioic acid, tricarballylic acid, beta-methyltricarballylic acid, 1,2,3,4-butanetetracarboxylic acid, itaconic acid, maleic acid, fumaric acid, citraconic acid, mesaconic acid, trans-glutatonic acid, trans-beta-hydromuconic acid, trans-traumatic acid, trans, trans-muconic acid, cis-aconitic acid, trans aconitic acid, (±)-chlorosuccinic acid, (±)-bromosuccinic acid, meso-2,3-dibromosuccinic acid, hexa fluoroglutaric acid, perfluoroadipic acid hydrate, dibromo-maleic acid, DL-malic acid, D-malic acid, L-malic acid, (R)-(−)-citramalic acid, (S)-(+)-citramalic acid, (±)-2-isopropylmalic acid, 3-hydroxy-3-methylglutaric acid, ketomalonic acid monohydrate, DL-tartaric acid, L-tartaric acid, D-tartaric acid, mucic acid, citric acid, citric acid monohydrate, dihydroflumaric acid hydrate, tetrahydrofuran-2,3,4,5-tetracarboxylic acid, mercaptosuccinic acid, meso-2,3-dimercaptosuccinic acid, thiodiglycolic acid, 3,3'-thiodipropionic acid, 3,3'-dithiodipropionic acid, 3-carboxypropyl disulfide, (±)-2-(carboxymethylthio) succinic acid, 2,2',2'',2'''-[1,2-ethanediylidenetetrakis(thio)]-tetrakisacetic acid, nitromethanetrispropionic acid, oxalacetic acid, 2-ketoglutaric acid, 2-oxoadipic acid hydrate, 1,3-acetonedicarboxylic acid, 3-oxoadipic acid, 4-ketopimelic acid, 5-oxoazelaic acid, chelidonic acid, 1,1-cyclopropanedicarboxylic acid, 1,1-cyclobutanedicarboxylic acid, (±)-trans-1,2-cyclobutanedicarboxylic acid, trans-DL-1,2-cyclopentanedicarboxylic acid, 3,3-tetramethyleneglutaric acid, (1R.3S)-(+)-camphoric acid, (1S.3R)-(−)-camphoric acid, (±)-cyclohexylsuccinic acid, 1,1-cyclohexanediacetic acid, (±)-trans-1,2-cyclohexanedicarboxylic acid, (±)-1,3-cyclohexanedicarboxylic acid, trans-1,2-cyclohexanedicarboxylic acid, 1,4-cyclohexanedicarboxylic acid, 1,3-adamantanedicarboxylic acid, 3-methylenecyclopropane-trans-1,2-dicarboxylic acid, cis-5-norbornene-endo-2,3-dicarboxylic acid, 1,3,5-cyclohexanetricarboxylic acid, 1,3,5-cyclohexanetricarboxylic acid, kemp's triacid, (1alpha.3alpha.5beta)-1,3,5-trimethyl-1,3,5-cyclohexanetricarboxylic acid, 1,2,3,4-cyclobutane-tetracarboxylic acid, and 1,2,3,4,5,6-cyclo-hexanehexacarboxylic acid monohydrate, phenylmalonic acid, benzylmalonic acid, phenylsuccinic acid, 3-phenylglutaric acid, 1,2-phenylenediacetic acid, homophthalic acid, 1,3-phenylenediacetic acid, 4-carboxyphenoxyacetic acid, 1,4-phenylenediacetic acid, 2,5-dihydroxy-1,4-benzenediacetic acid, 1,4-phenylenediacrylic acid, phthalic acid, isophthalic acid, 1,2,3-benzenetricarboxylic acid hydrate, terephthalic acid, 1,2,4-benzenetricarboxylic acid, 1,2,4,5-benzenetetracarboxylic acid, mellitic acid, 3-(carboxymethylaminomethyl)-4-hydroxybenzoic acid, 4-methylphthalic acid, 2-bromoterephthalic acid, 4-bromoisophthalic acid, 4-hydroxyisophthalic acid, 4-nitrophthalic acid, nitrophthalic acid, 1,4-phenylenedipropionic acid, 5-tert-butylisophthalic acid, 5-hydroxyisophthalic acid, 5-nitroisophthalic acid, 5-(4-carboxy-2-nitrophenoxy)-isophthalic acid, diphenic acid, 4,4'-biphenyldicarboxylic acid, 5,5'dithiobis(2-nitrobenzoic acid), 4-[4-(2-carboxybenozoyl)phenyl]-butyric acid, pamoic acid, 1,4-naphthalenedicarboxylic acid, 2,3-naphthalenedicarboxylic acid, 2,6-naphthalenedicarboxylic acid, 1,4,5,8-naphthalene-tetracarboxylic acid hydrate, 2,7-di-tert-butyl-9,9-dimethyl-4,5-xanthenedicarboxylic acid, and the like.

A particularly useful carboxylic acid for the preparation of the latent fluxing agents of the present invention is DIACID 1550®, a monocyclic $C_{21}$ dicarboxylic acid product derived from tall oil fatty acids, commercially available from Westvaco Corporation.

Fillers contemplated for use in the practice of the present invention can be electrically conductive and/or thermally conductive, and/or fillers which act primarily to modify the rheology of the resulting composition. Examples of suitable electrically conductive fillers which can be employed in the practice of the present invention include silver, nickel, copper, aluminum, palladium, gold, graphite, metal-coated graphite (e.g., nickel-coated graphite, copper-coated graphite, and the like), and the like. Examples of suitable thermally conductive fillers which can be employed in the practice of the present invention include graphite, aluminum nitride, silicon carbide, boron nitride, diamond dust, alumina, and the like. Compounds which act primarily to modify rheology include polysiloxanes (such as polydimethyl siloxanes) silica, fumed silica, alumina, titania, and the like.

Optionally, a curing initiator may be incorporated into the invention underfill compositions. The at least one curing initiator is typically present in the composition from 0.1 wt % to about 5 wt % based on total weight of the composition, and is typically a free-radical initiator. As used herein, the term "free radical initiator" refers to any chemical species which, upon exposure to sufficient energy (e.g., light, heat, or the like), decomposes into two parts which are uncharged, but which each possess at least one unpaired electron. Preferred free radical initiators contemplated for use in the practice of the present invention are compounds which decompose (i.e., have a half life in the range of about 10 hours) at temperatures in the range of about 70° C. up to 180° C. Exemplary free radical initiators contemplated for use in the practice of the present invention include peroxides (e.g., dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl)benzene, and tert-butyl hydroperoxide), azo compounds (e.g., 2,2'-azobis(2-methyl-propanenitrile), 2,2'-azobis(2-methylbutanenitrile), and 1,1'-azobis(cyclohexanecarbonitrile)), and the like.

The term "free radical initiator" also includes photoinitiators. For example, for invention adhesive compositions that contain a photoinitiator, the curing process can be initiated by UV radiation. In one embodiment, the photoinitiator is present at a concentration of 0.1 wt % to 5 wt % based on the total weight of the organic compounds in the composition (excluding any filler). In a one embodiment, the photoinitiator comprises 0.1 wt % to 3.0 wt %, based on the total weight of the organic compounds in the composition. Photoinitiators include benzoin derivatives, benzilketals, α,α-dialkoxyacetophenones, α-hydroxyalkylphenones, α-aminoalkylphenones, acylphosphine oxides, titanocene compounds, combinations of benzophenones and amines or Michler's ketone, and the like.

Optionally, a coupling agent may be incorporated into the invention underfill compositions. As used herein, the term "coupling agent" refers to chemical species that are capable of bonding to a mineral surface and which also contain polymerizably reactive functional group(s) so as to enable interaction with the adhesive composition. Coupling agents thus facilitate linkage of the die-attach paste to the substrate to which it is applied.

Exemplary coupling agents contemplated for use in the practice of the present invention include silicate esters, metal acrylate salts (e.g., aluminum methacrylate), titanates (e.g., titanium methacryloxyethylacetoacetate triisopropoxide), or compounds that contain a copolymerizable group and a chelating ligand (e.g., phosphine, mercaptan, acetoacetate, and the like). In some embodiments, the coupling agents contain both a co-polymerizable function (e.g., vinyl moiety, acrylate moiety, methacrylate moiety, and the like), as well as a silicate ester function. The silicate ester portion of the coupling agent is capable of condensing with metal hydroxides present on the mineral surface of substrate, while the co-polymerizable function is capable of co-polymerizing with the other reactive components of invention die-attach paste. In certain embodiments coupling agents contemplated for use in the practice of the invention are oligomeric silicate coupling agents such as poly(methoxyvinylsiloxane).

In some embodiments, both photoinitiation and thermal initiation may be desirable. For example, curing of a photoinitiator-containing adhesive can be started by UV irradiation, and in a later processing step, curing can be completed by the application of heat to accomplish a free-radical cure. Both UV and thermal initiators may therefore be added to the adhesive composition.

In general, the underfill compositions of the invention will cure within a temperature range of 80-220° C., and curing will be effected within a length of time of less than 1 minute to 60 minutes. Typically, underfill encapsulation takes place simultaneously with reflow of the solder or polymeric interconnects. Thus, the underfill compositions described herein, which include a fluxing agent if solder is the interconnect material, first is applied to either the substrate or the component; then terminals on the component and substrate are aligned and contacted and the assembly heated to reflow the metallic or polymeric interconnect material. During this heating process, curing of the underfill composition occurs simultaneously with reflow of the metallic or polymeric interconnect material As will be understood by those skilled in the art, the time and temperature curing profile for each underfill composition will vary, and different compositions can be designed to provide the curing profile that will be suited to the particular industrial manufacturing process.

In certain embodiments, the underfill compositions may contain compounds that lend additional flexibility and toughness to the resultant cured composition. Such compounds may be any thermoset or thermoplastic material having a Tg of 50° C. or less, and typically will be a polymeric material characterized by free rotation about the chemical bonds, the presence of ether groups, and the absence of ring structures. Suitable such modifiers include polyacrylates, poly(butadiene), polyTHF (polymerized tetrahydrofuran, also known as poly(1,4-butanediol)), CTBN (carboxy-terminated butadiene-acrylonitrile) rubber, and polypropylene glycol.

Inhibitors for free-radial cure may also be added to the underfill compositions described herein to extend the useful shelf life of compositions containing the polyester linked acrylates and methacrylates. Examples of these inhibitors include hindered phenols such as 2,6-di-tert-butyl-4-methylphenol; 2,6-di-tert-butyl-4-methoxyphenol; tert-butyl hydroquinone; tetrakis(methylene(3,5-di-tert-butyl-4-hydroxyhydrocinnamate))benzene; 2,2'-methylenebis(6-tert-butyl-p-cresol); and 1,3,5-trimethyl-2,4,6-tris(3',5'-di-tert-butyl-4-hydroxybenzyl)benzene. Other useful hydrogen-donating antioxidants include derivatives of p-phenylenediamine and diphenylamine. It is also well know in the art that hydrogen donating antioxidants may be synergistically combined with quinones, and metal deactivators to make a very efficient inhibitor package. Examples of suitable quinones include benzoquinone, 2-tert butyl-1,4-benzoquinone; 2-phenyl-1,4-benzoquinone; naphthoquinone, and 2,5-dichloro-1,4-benzoquinone. Examples of metal deactivators include N,N'-bis (3,5-di-tert-butyl-4-hydroxyhydrocinnamoyl)hydrazine; oxalyl bis(benzylidenehydrazide); and N-phenyl-N'-(4-toluenesulfonyl)-p-phenylenediamine. Nitroxyl radical compounds such as TEMPO (2,2,6,6-tetramethyl-1-piperidnyloxy, free radical) are also effective as inhibitors at low concentrations. The total amount of antioxidant plus synergists typically falls in the range of 100 to 2000 ppm relative to the weight of total base resin. Other additives, such as adhesion promoters, in types and amounts known in the art, may also be added.

These compositions will perform within the commercially acceptable range for underfill compositions. Commercially acceptable values for die shear for the adhesives on a 80×80 mil$^2$ silicon die are in the range of greater than or equal to 1 kg at room temperature, and greater than or equal to 0.5 kg at 240° C. Acceptable values for warpage for a 500×500 mil$^2$ die are in the range of less than or equal to 70 Nm at room temperature.

In yet another embodiment of the invention, there are provided assemblies of components adhered together employing the above-described underfill compositions. Thus, for example, assemblies comprising a first article permanently adhered to a second article by a cured aliquot of the above-described underfill compositions are provided. Articles contemplated for assembly employing invention compositions include memory devices, ASIC devices, microprocessors, flash memory devices, and the like. Also contemplated are assemblies comprising a microelectronic device permanently adhered to a substrate by a cured aliquot of the above-described underfill compositions. Microelectronic devices contemplated for use with invention die attach pastes include copper lead frames, Alloy 42 lead frames, silicon dice, gallium arsenide dice, germanium dice, and the like.

Conditions suitable to cure invention underfill compositions include subjecting the above-described assembly to a temperature of less than about 200° C. for about 0.5 up to 2 minutes. This rapid, short duration heating can be accomplished in a variety of ways, e.g., with an in-line heated rail, a belt furnace, or the like. Optionally, the material can be oven cured at 150-220° C.

In another embodiment, there are provided methods for adhesively attaching a silicon die having at least one solderable contact to a substrate. Such methods can be performed, for example, by a) contacting the die with the substrate via the at least one solderable contact, thereby forming an electronic assembly;

b) providing an underfill composition of the invention between the die and the substrate;

c) subjecting the assembly to a temperature sufficient to reflow the solderable contacts and cure the underfill composition, thereby adhesively attaching a silicon die having at least one solderable contact to a substrate.

It is understood that using the compounds and methods of the present invention, it is possible to prepare underfill compositions having a wide range of cross-link density by the judicious choice and amount of polyester-linked compounds. The greater proportion of polyfunctional compounds reacted, the greater the cross-link density. If thermoplastic properties are desired, the underfill compositions can be prepared from (or at least contain a higher percentage of) mono-functional compounds to limit the cross-link density. A minor amount of poly-functional compounds can be added to provide some cross-linking and strength to the composition, provided the amount of poly-functional compounds is limited to an amount that does not diminish the desired thermoplastic properties. Within these parameters, the strength and elasticity of individual adhesives can be tailored to a particular end-use application.

"Cross-linking," as used herein, refers to the attachment of two or more polymer chains by bridges of an element, a molecular group, or a compound. In general, crosslinking of the compositions of the invention takes place upon heating. As crosslinking density is increased, the properties of a material can be changed from thermoplastic to thermosetting.

EXAMPLES

Example 1

The following describes an exemplary synthesis of a polyester linked acrylate or methacrylate according to the invention.

Synthesis of Compound 1

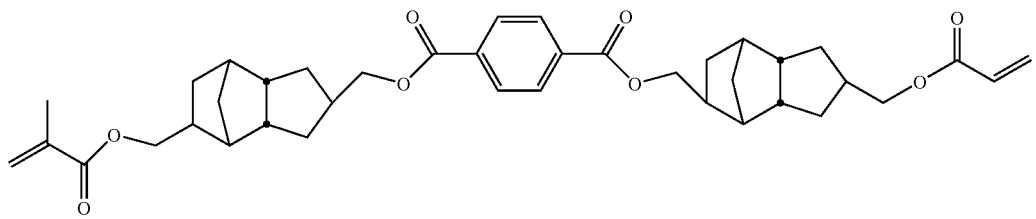

To a 500 mL round bottomed flask was added terephthalic acid (8.31 g, 50 mmol), dicyclopentadiene-dimethanol (23.6 g, 120 mmol), toluene (110 g), and methane sulfonic acid (3.5 g). This mixture was refluxed for 1.5 hours, at which time 2.0 mL of water was collected in a Dean-Stark trap. Next, acrylic acid (7.23 g, 100 mmol) and methacrylic acid (8.62 g, 100 mmol) and an additional 200 mL of toluene were added to the reaction flask. This mixture was refluxed for 2.25 hours, at which time 2.3 mL water had collected in the Dean-Stark trap. This material was then worked up with NaHCO₃ (25 g) and 3.5 g water followed by 21 g MgSO₄. Once all gas evolution had ceased, the solution was passed through silica gel and the toluene was removed by rotary evaporation, affording the product (Compound 1) (36.6 g, 95% yield).

Example 2 g, 120 mmol), toluene (110 g), and methane sulfonic acid (3.5 g). This mixture was refluxed for 1.5 hours, at which time 2.0 mL of water was collected in a Dean-Stark trap. Next, acrylic acid (7.23 g, 100 mmol) and methacrylic acid (8.62 g, 100 mmol) and an additional 200 mL of toluene were added to the reaction flask. This mixture was refluxed for 2.5 hours, at which time 2.3 mL water had collected in the Dean-Stark trap. This material was then worked up with NaHCO₃ (25 g) and 3.5 g water followed by 21 g MgSO₄. Once all gas evolution had ceased, the solution was passed through silica gel and the toluene was removed by rotary evaporation, affording the product (Compound 2) (36.6 g, 95% yield).

Synthesis of Compound 2

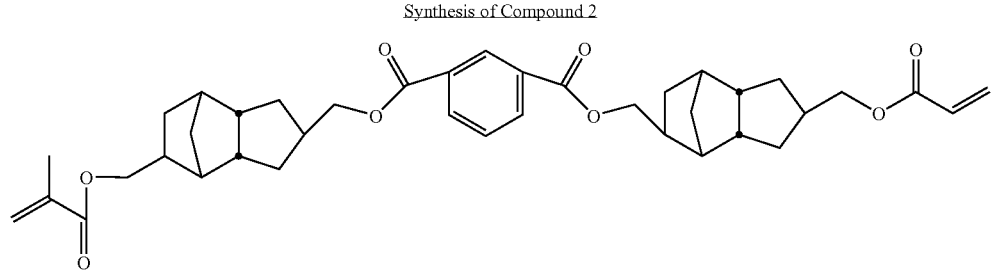

To a 500 mL round bottomed flask was added isophthalic acid (8.31 g, 50 mmol), dicyclopentadiene-dimethanol (23.6

Example 3

Synthesis of Compound 3

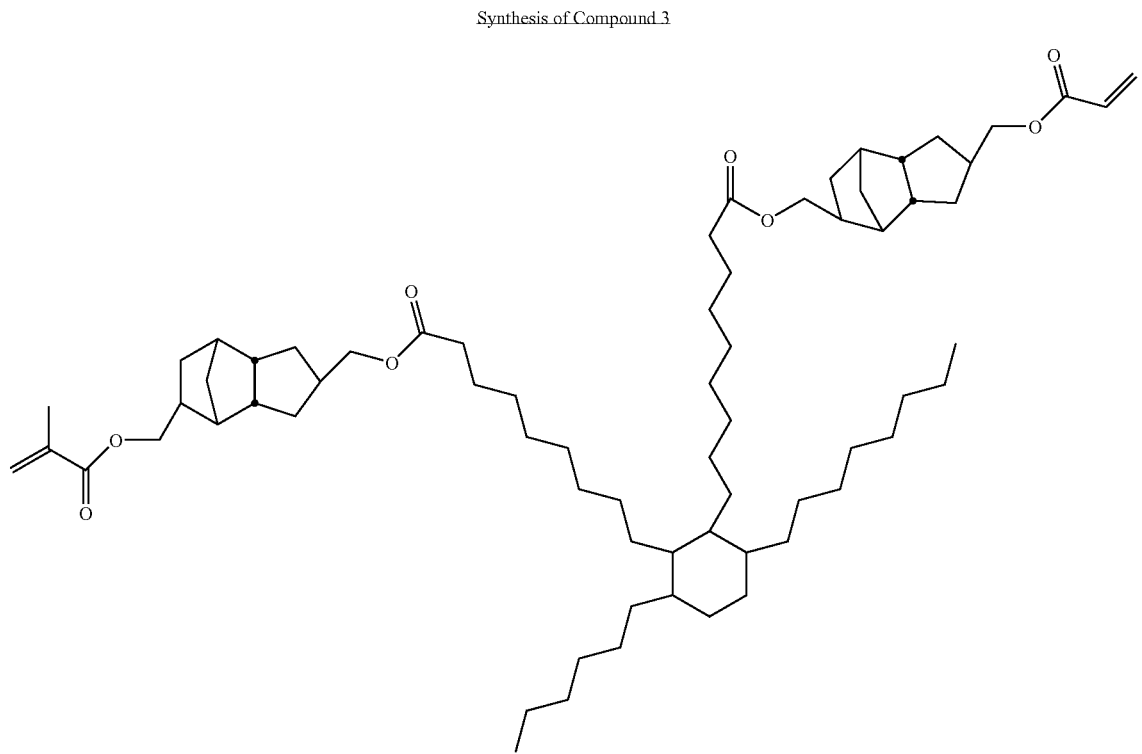

To a 500 mL round bottomed flask was added the dimmer acid Cognis Empol 1008 (28.27 g, 50 mmol), dicyclopentadiene-dimethanol (23.6 g, 120 mmol), toluene (110 g), and methane sulfonic acid (3.5 g). This mixture was refluxed for 0.5 hours, at which time 2.0 mL of water was collected in a Dean-Stark trap. Next, acrylic acid (7.23 g, 100 mmol) and methacrylic acid (8.62 g, 100 mmol) and an additional 200 mL of toluene were added to the reaction flask. This mixture was refluxed for 2.5 hours, at which time 2.1 mL water had collected in the Dean-Stark trap. This material was then worked up with $NaHCO_3$ (25 g) and 3.5 g water followed by 21 g $MgSO_4$. Once all gas evolution had ceased, the solution was passed through silica gel and the toluene was removed by rotary evaporation, affording the product (Compound 3) (54.6 g, 93% yield).

Example 4

Synthesis of Compound 4

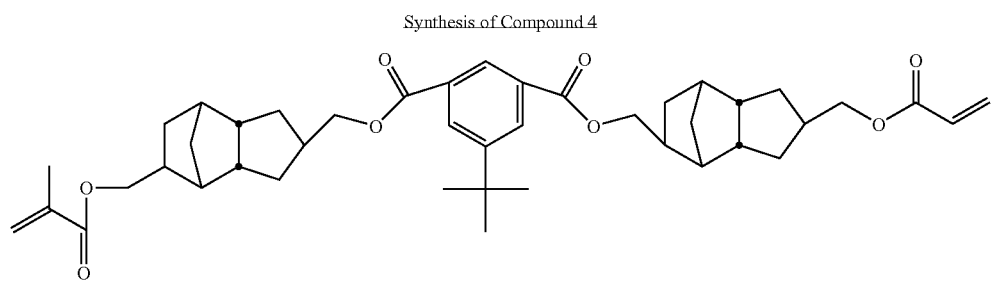

To a 500 mL round bottomed flask was added 5-t-butyl-isophthalic acid (11.2 g, 50 mmol), dicyclopentadiene-dimethanol (23.6 g, 120 mmol), toluene (110 g), and methane sulfonic acid (1.0 g). This mixture was refluxed for 2 hours, at which time 1.8 mL of water was collected in a Dean-Stark trap. Next, acrylic acid (7.23 g, 100 mmol), methacrylic acid (8.62 g, 100 mmol), methane sulfonic acid (1.5 g), and an additional 120 mL of toluene were added to the reaction flask. This mixture was refluxed for 2.5 hours, at which time 2.3 mL water had collected in the Dean-Stark trap. This material was then worked up with $NaHCO_3$ (25 g) and 3.5 g water followed by 21 g $MgSO_4$. Once all gas evolution had ceased, the solution was passed through silica gel and the toluene was removed by rotary evaporation, affording the product (Compound 4) (39.8 g, 96% yield).

While this invention has been described with respect to these specific examples, it should be clear that other modifications and variations would be possible without departing from the spirit of this invention.

What is claimed is:

1. An underfill composition comprising
   a) at least one compound having the structure:

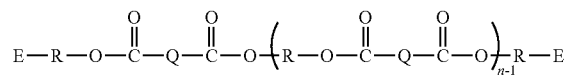

wherein:
   R is selected from the group consisting of a substituted or an unsubstituted cyclopentyl, cyclohexyl, norbornyl, tetracyclododecyl, and dicyclopentadienyl;
   Q is selected from the group consisting of a substituted or an unsubstituted aliphatic, a substituted or an unsubstituted aryl, and a substituted or an unsubstituted heteroaryl;
   each E is independently selected from the group consisting of an acrylate, a methacrylate, a ring-opening moiety and a ring-forming polymerizable moiety; and
   n is an integer having the value between 1 and about 10;
   b) an acidic fluxing agent; and
   c) a filler.

2. The underfill composition of claim 1, wherein Q is a substituted or an unsubstituted aryl or a substituted or an unsubstituted heteroaryl having between about 6 and about 14 carbon atoms.

3. The underfill composition of claim 1, wherein Q is a substituted or an unsubstituted phenyl or naphthyl.

4. The underfill composition of claim 1, wherein the at least one compound has any one of the following structures:

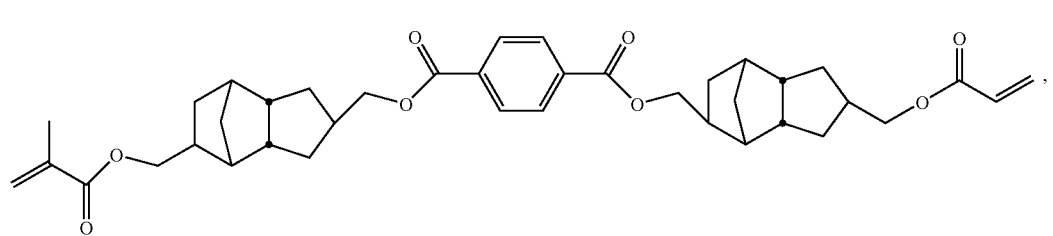
Compound 1
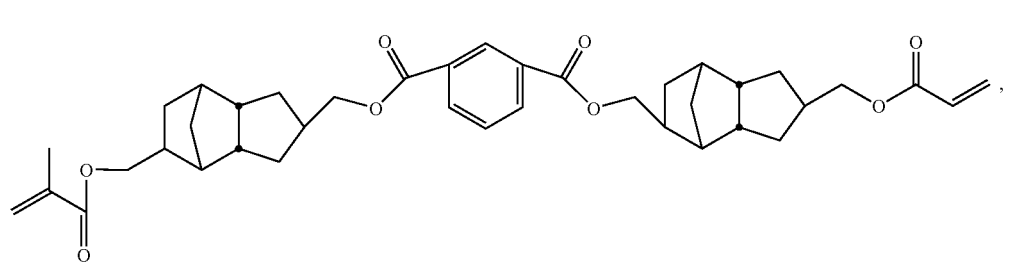
Compound 2
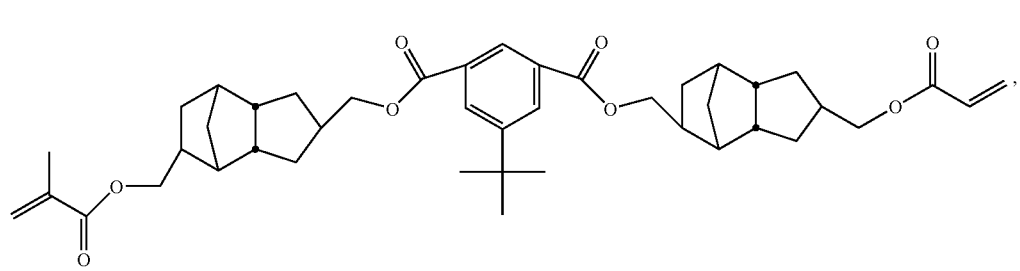
Compound 3
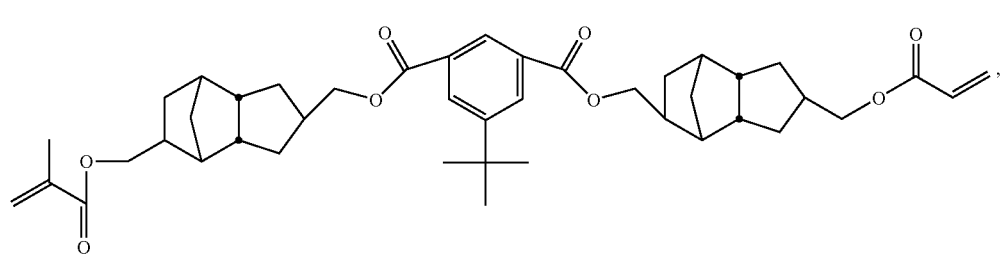
Compound 4
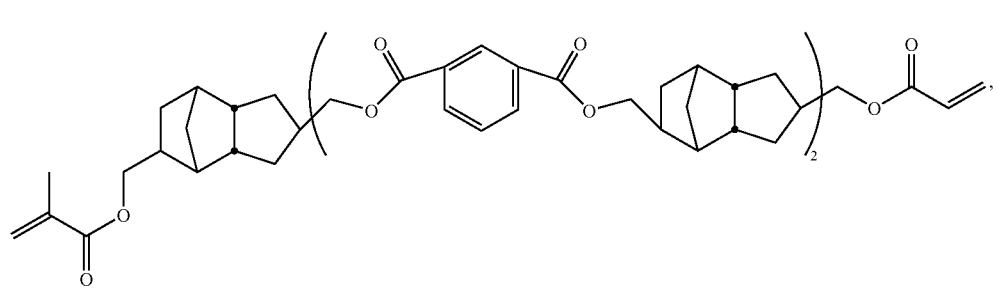
Compound 5

-continued
Compound 6
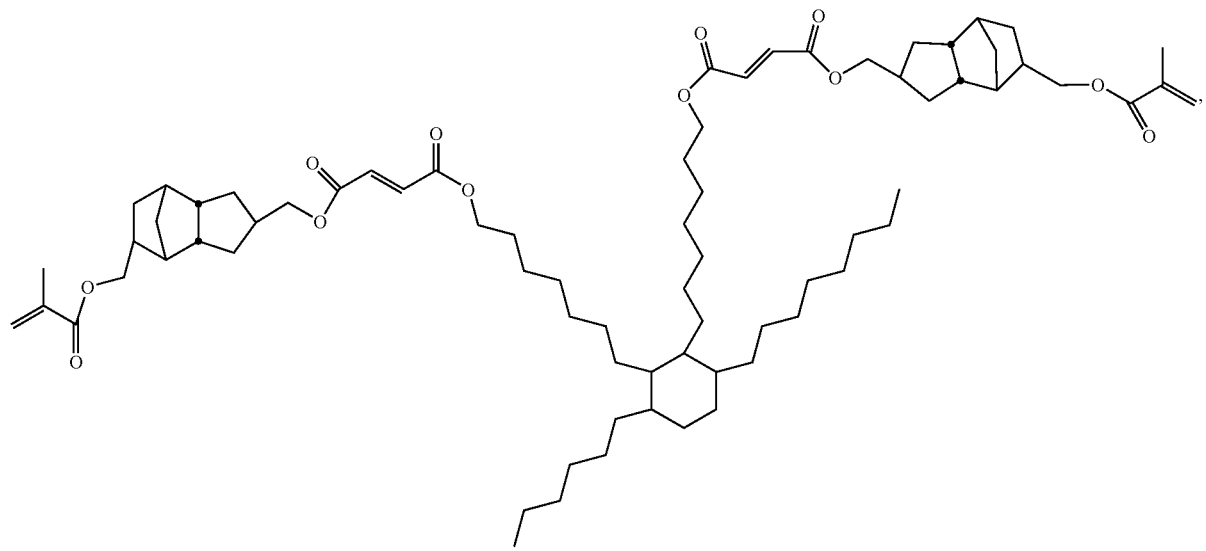
Compound 7
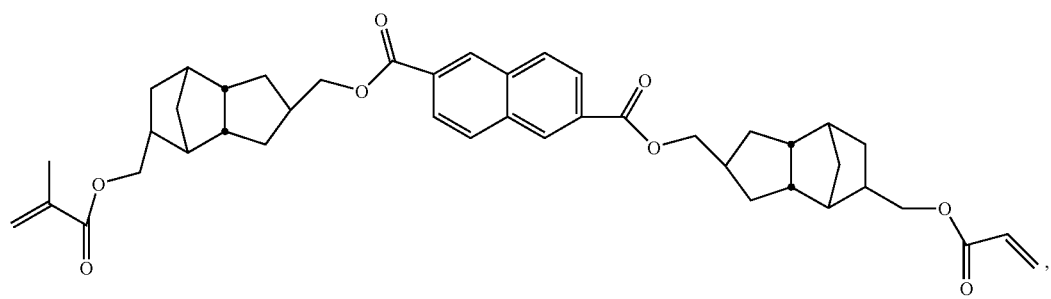
Compound 8
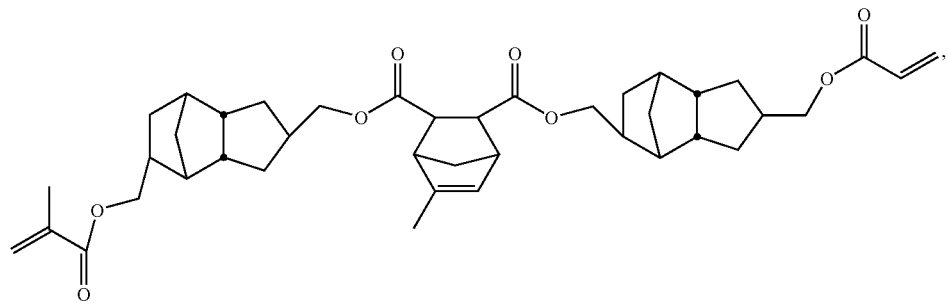
Compound 9
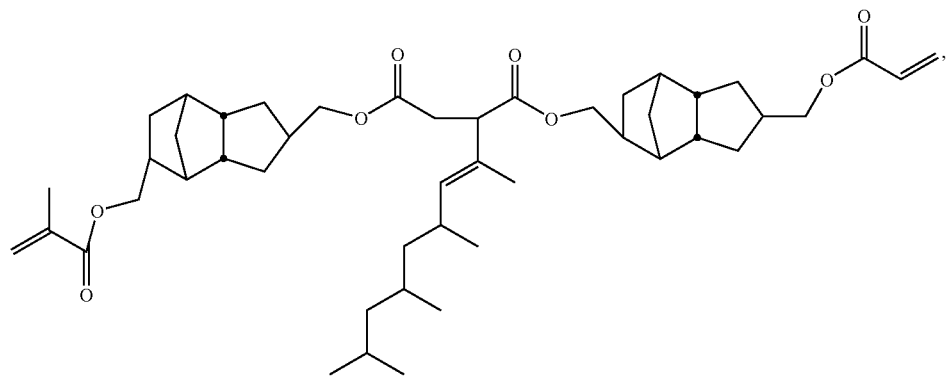

-continued
Compound 10
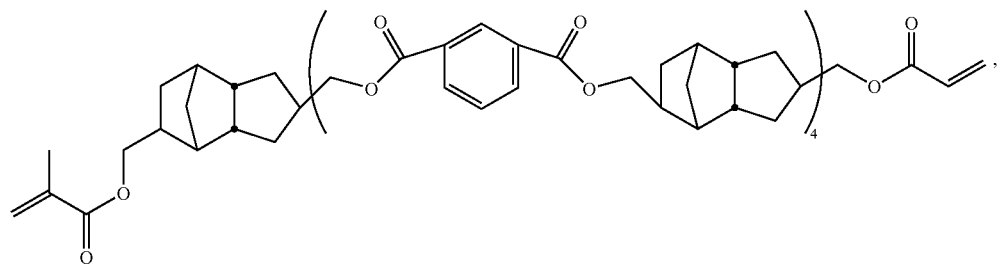
Compound 11
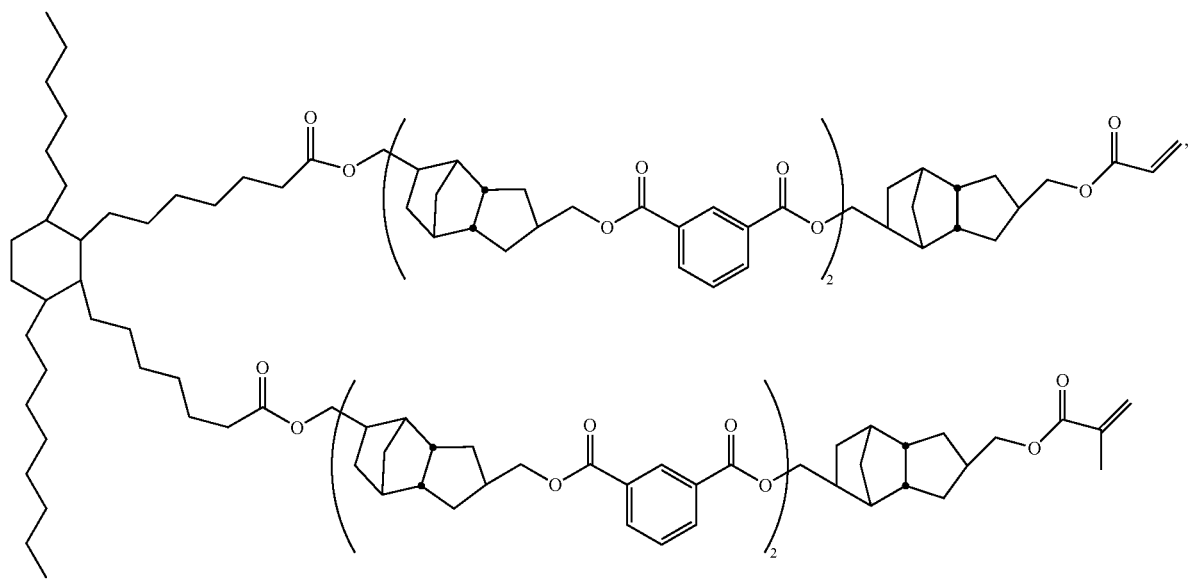
Compound 12
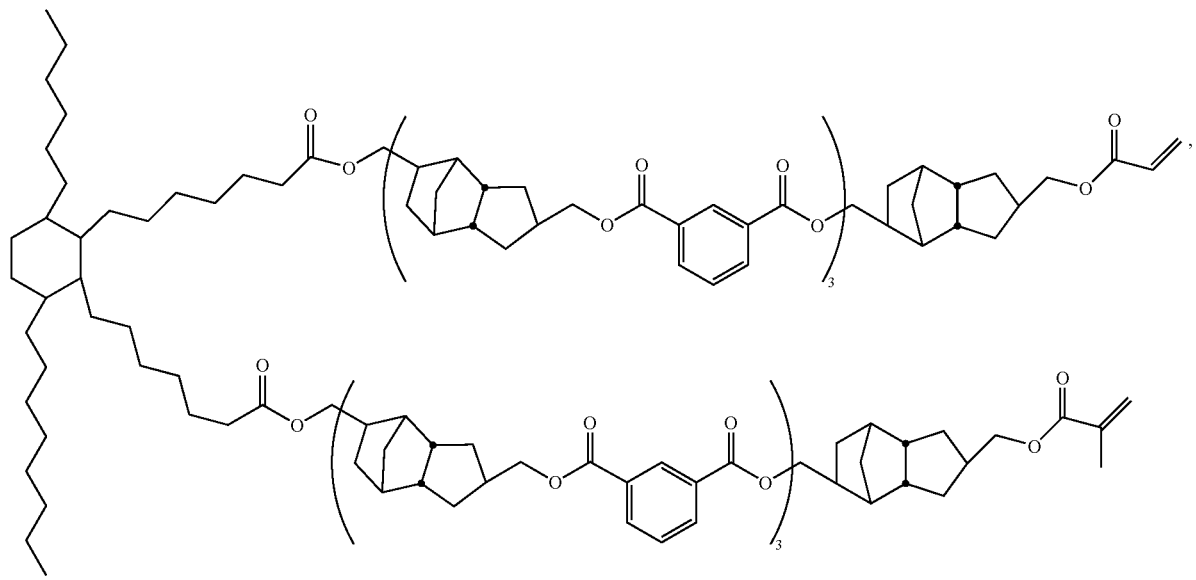

-continued
Compound 13
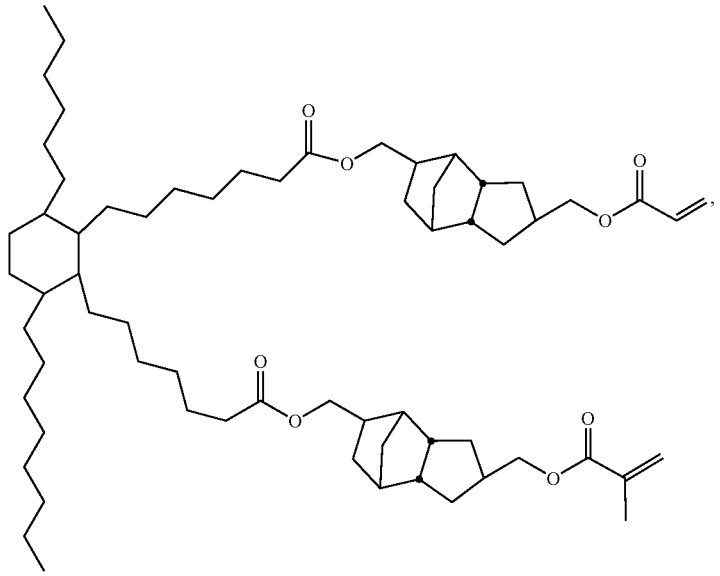
Compound 14
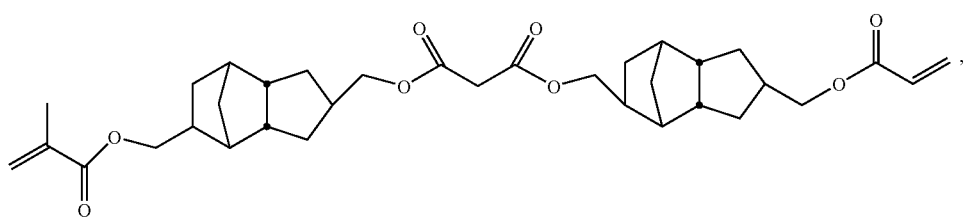
Compound 15
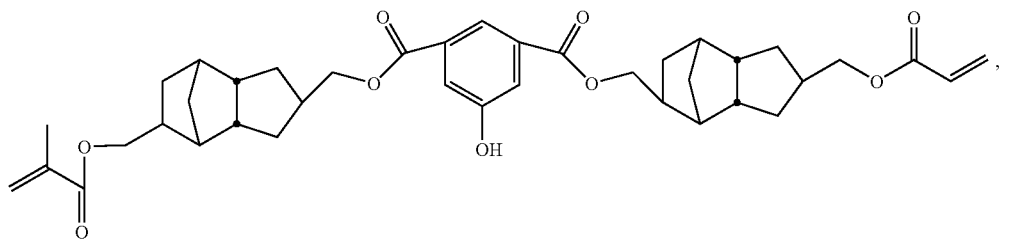
Compound 16
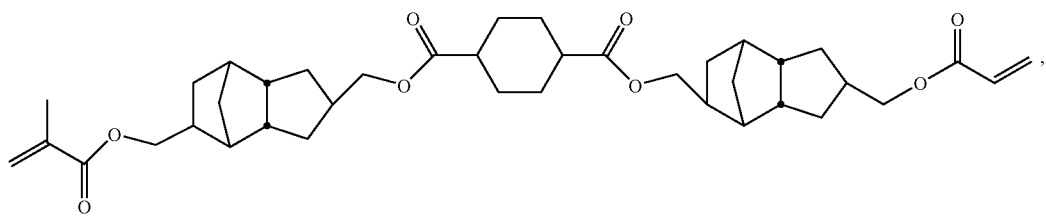

-continued
Compound 17
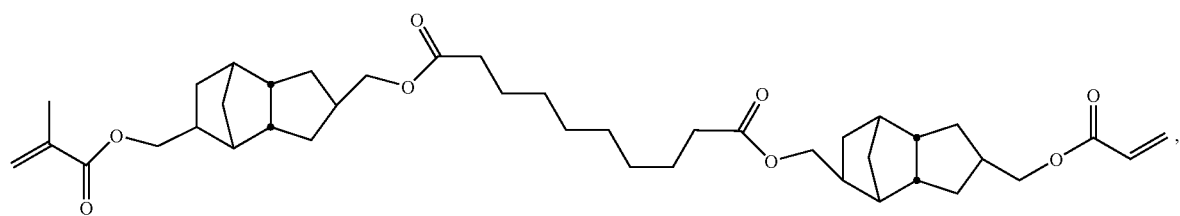
Compound 18
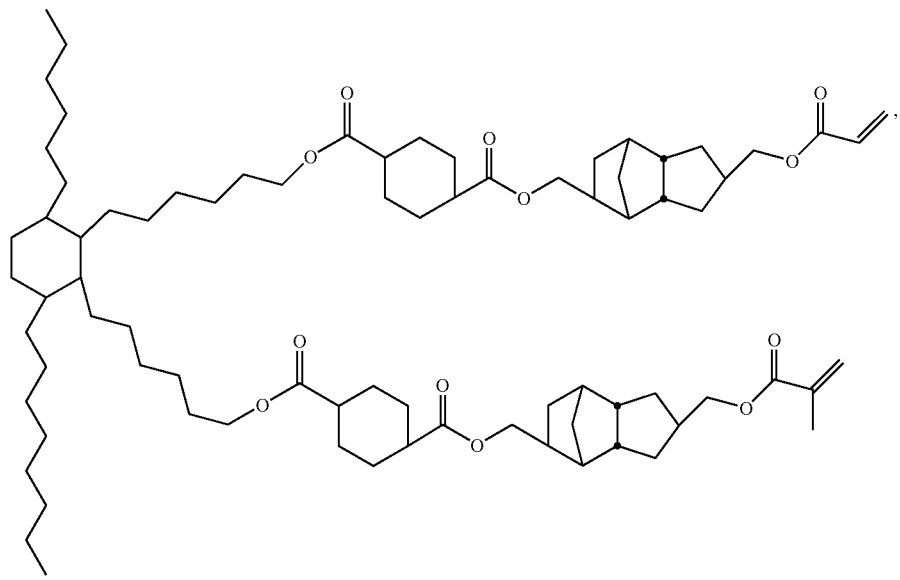
Compound 19
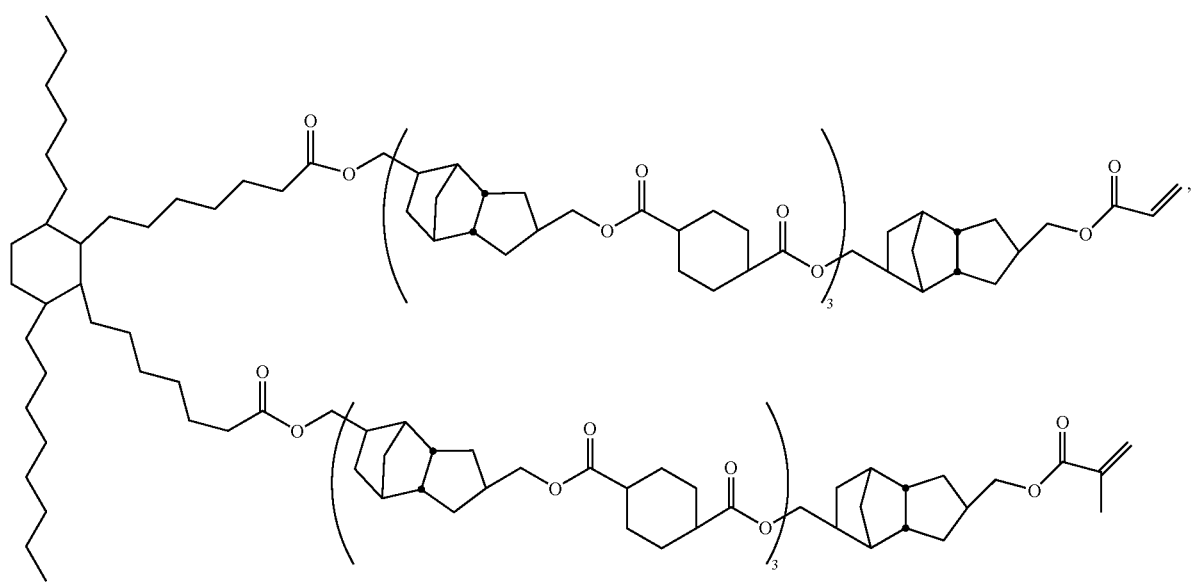

-continued

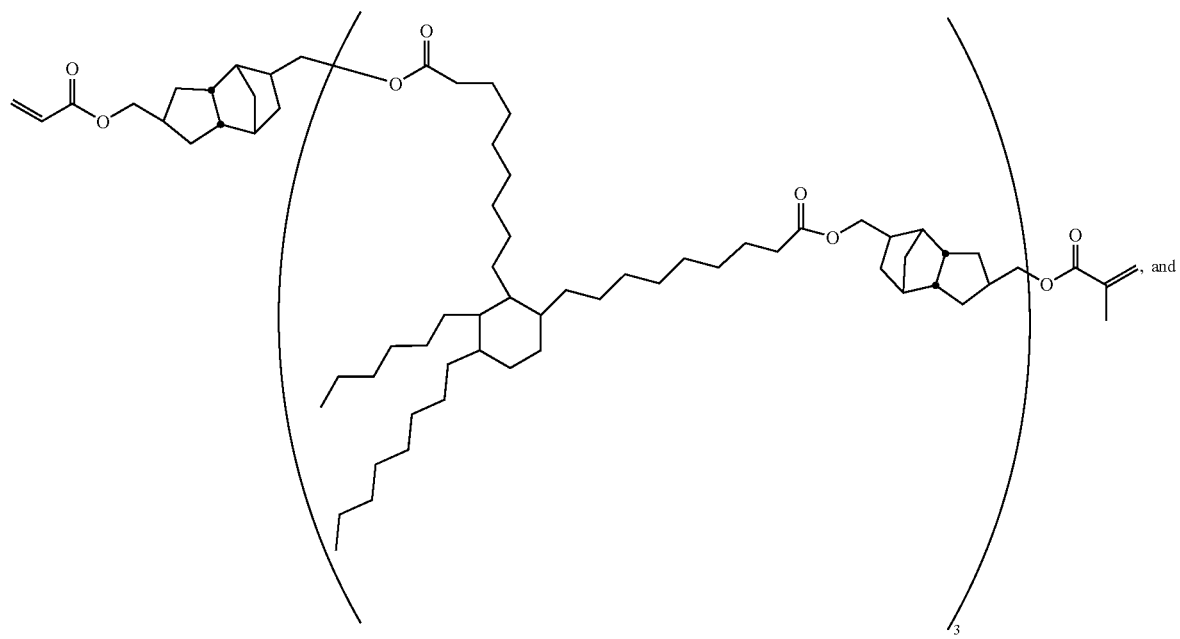

Compound 20

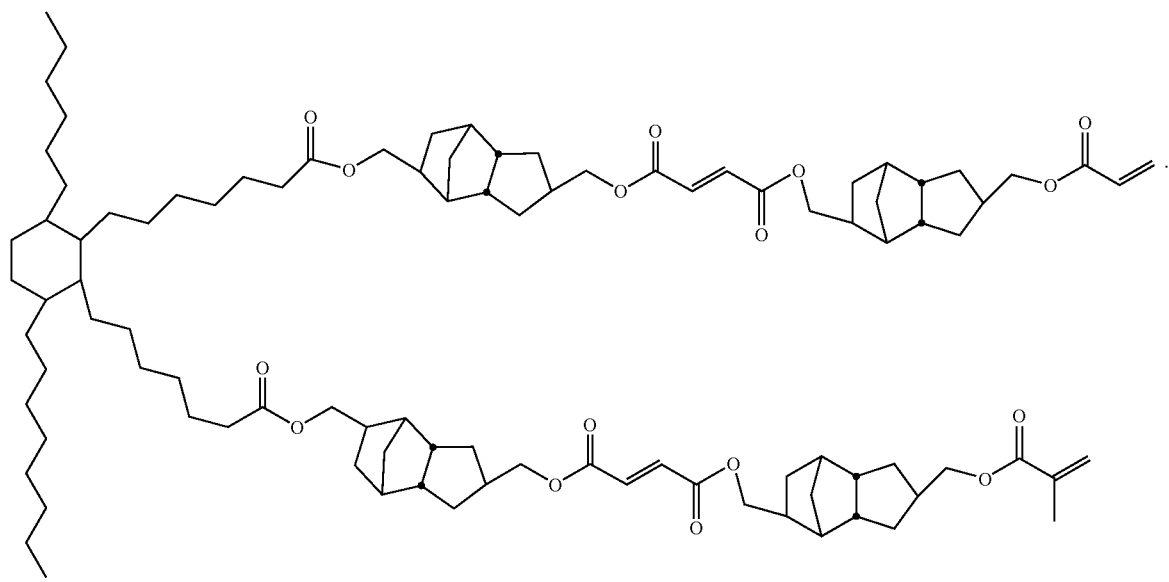

Compound 21

5. The underfill composition of claim 1, wherein the compound comprises a ring-opening or a ring-forming polymerizable moiety.

6. The underfill composition of claim 1, further comprising at least one curing initiator.

7. The underfill composition of claim 6, wherein the at least one curing initiator comprises between about 0.1 wt % and about 5 wt % of the total weight of the composition.

8. The underfill composition of claim 6, wherein the at least one curing initiator comprises a free-radical initiator or a photoinitiator.

9. The underfill composition of claim 1, wherein the filler is silica.

10. The underfill composition of claim 9, wherein the silica has a particle size in the range of between about 1 μm and about 100 μM.

11. The underfill composition of claim 1, wherein the value of n is between 1 and about 7.

12. The underfill composition of claim 1, wherein the value of n is between 1 and about 5.

13. The underfill composition of claim 1, wherein the value of n is between 1 and about 3.

14. The underfill composition of claim 1, wherein the value of n is 1 or 2.

15. The underfill composition of claim 1, wherein the acidic fluxing agent comprises a carboxylic acid.

16. The underfill composition of claim 1, wherein the acidic fluxing agent comprises a dicarboxylic acid.

* * * * *